(12) United States Patent
Fakhruddin et al.

(10) Patent No.: US 10,325,901 B1
(45) Date of Patent: Jun. 18, 2019

(54) CIRCUIT FOR INCREASING THE IMPEDANCE OF AN ESD PATH IN AN INPUT/OUTPUT CIRCUIT AND METHOD OF IMPLEMENTING THE SAME

(71) Applicant: Xilinx, Inc., San Jose, CA (US)

(72) Inventors: Mohammed Fakhruddin, San Jose, CA (US); James Karp, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 12 days.

(21) Appl. No.: 15/399,672

(22) Filed: Jan. 5, 2017

(51) Int. Cl.
| H01L 27/02 | (2006.01) |
| H01L 23/00 | (2006.01) |
| H01L 23/64 | (2006.01) |
| H01L 25/065 | (2006.01) |
| H01L 21/48 | (2006.01) |
| H01L 25/00 | (2006.01) |
| H01L 23/498 | (2006.01) |

(52) U.S. Cl.
CPC ...... *H01L 27/0248* (2013.01); *H01L 21/4853* (2013.01); *H01L 23/49838* (2013.01); *H01L 23/647* (2013.01); *H01L 24/16* (2013.01); *H01L 25/0652* (2013.01); *H01L 25/50* (2013.01); *H01L 27/0288* (2013.01); *H01L 27/0296* (2013.01); *H01L 2224/16157* (2013.01); *H01L 2225/06513* (2013.01); *H01L 2225/06555* (2013.01)

(58) Field of Classification Search
CPC ............. H01L 27/0248; H01L 27/0251; H01L 27/0288; H01L 27/0292; H01L 27/0296; H01L 23/647; H01L 23/60
See application file for complete search history.

(56) References Cited

U.S. PATENT DOCUMENTS

| 5,477,414 A | 12/1995 | Li et al. |
| 5,489,866 A | 2/1996 | Diba |
| 5,610,790 A | 3/1997 | Staab et al. |
| 5,623,387 A | 4/1997 | Li et al. |
| 5,689,133 A | 11/1997 | Li et al. |
| 5,959,821 A | 9/1999 | Voogel |
| 6,184,557 B1 * | 2/2001 | Poplevine ........... H01L 27/0255 257/357 |
| 6,268,639 B1 | 7/2001 | Li et al. |
| 6,569,576 B1 | 5/2003 | Hsueh et al. |
| 6,645,802 B1 | 11/2003 | Li et al. |

(Continued)

OTHER PUBLICATIONS

J. Karp, M. Hart, M. Fakhruddin, V. Kireev, P. Tan, D. Tsaggaris, M. Rawatt, "Interposer FPGA with Self-protecting ESD Design for Inter-die Interfaces and its CDM Specification", IEEE IRPS 2016.

*Primary Examiner* — Marc Anthony Armand
*Assistant Examiner* — Younes Boulghassoul
(74) *Attorney, Agent, or Firm* — John J. King (57) ABSTRACT

A circuit for implementing a discharge path in an input/output circuit of an integrated circuit is described. The circuit comprises an input/output pad; a first node coupled to a power reference voltage; a first impedance element implemented between the first node and the input/output pad; a second node coupled to a ground reference voltage; and a second impedance element implemented between the second node and the input/output pad. A method of implementing a discharge path in an input/output circuit of an integrated circuit is also disclosed.

19 Claims, 7 Drawing Sheets

(56) References Cited

U.S. PATENT DOCUMENTS

| | | |
|---|---|---|
| 6,740,936 B1 | 5/2004 | Gitlin et al. |
| 6,760,205 B1 | 7/2004 | Gaboury |
| 6,972,939 B1 | 12/2005 | Ho et al. |
| 6,978,541 B1 | 12/2005 | Feltner et al. |
| 7,372,679 B1 | 5/2008 | Ho et al. |
| 7,812,674 B2 | 10/2010 | Karp |
| 7,872,346 B1 | 1/2011 | Chee et al. |
| 7,919,845 B2 | 4/2011 | Karp et al. |
| 8,134,813 B2 | 3/2012 | Karp et al. |
| 8,174,112 B1 | 5/2012 | Karp et al. |
| 8,181,140 B2 | 5/2012 | Kireev et al. |
| 8,194,372 B1 | 6/2012 | Chong et al. |
| 8,218,277 B2 | 7/2012 | Li et al. |
| 8,453,092 B2 | 5/2013 | Kireev et al. |
| 8,611,058 B2 * | 12/2013 | Fan .................. H01L 27/0617 361/118 |
| 8,717,723 B2 | 5/2014 | Kireev et al. |
| 8,866,229 B1 | 10/2014 | Fakhruddin et al. |
| 8,881,085 B1 | 11/2014 | Karp et al. |
| 8,947,839 B2 | 2/2015 | Karp |
| 8,981,491 B1 | 3/2015 | Hart et al. |
| 8,982,581 B2 | 3/2015 | Karp et al. |
| 9,013,844 B2 | 4/2015 | Karp |
| 9,013,845 B1 | 4/2015 | Karp |
| 9,136,690 B1 | 9/2015 | Upadhyaya et al. |
| 9,379,109 B1 | 6/2016 | Karp et al. |
| 2001/0033004 A1 * | 10/2001 | Lin .................. H01L 27/0251 257/360 |
| 2008/0007290 A1 * | 1/2008 | Kubo .................. G06F 13/4086 326/30 |
| 2010/0246077 A1 * | 9/2010 | Jeong .................. H01L 23/60 361/56 |
| 2014/0198416 A1 * | 7/2014 | Karp .................. H01L 27/0251 361/56 |

\* cited by examiner

CIRCUIT FOR INCREASING THE IMPEDANCE OF AN ESD PATH IN AN INPUT/OUTPUT CIRCUIT AND METHOD OF IMPLEMENTING THE SAME

FIELD TECHNICAL

The present invention relates generally to integrated circuit devices, and in particular, to circuits for and methods of implementing a discharge path an input/output circuit of an integrated circuit.

BACKGROUND

An electrostatic discharge (ESD) event refers to a temporary and abrupt flow of current between two objects of differing electrical potentials. ESD can be a serious issue for a solid-state electronic integrated circuit (IC) as large potential changes and current flows that occur during the ESD event can damage silicon junctions and oxide insulators. Damage to an IC from the ESD event can diminish the performance of the silicon-based IC, if not render the IC inoperable. A charge buildup on an IC can occur for a variety of different reasons and can occur during manufacturing, assembly, testing, and/or use of the IC. As a result, the IC can be subjected to inadvertent ESD events prior, and subsequent, to assembly and sale.

Accordingly, circuits and methods of implementing a discharge path in an input/output circuit are desired.

SUMMARY

A circuit for implementing a discharge path in an input/output circuit of an integrated circuit is described. The circuit comprises an input/output pad; a first node coupled to a power reference voltage; a first impedance element implemented between the first node and the input/output pad; a second node coupled to a ground reference voltage; and a second impedance element implemented between the second node and the input/output pad.

A method of implementing a circuit having a discharge path in an input/output circuit of an integrated circuit is also described. The method comprises implementing an input/output pad; coupling a first node to a power reference voltage; implementing a first impedance element between the first node and the input/output pad; coupling a second node to a ground reference voltage; and implementing a second impedance element between the second node and the input/output pad.

Other features will be recognized from consideration of the Detailed Description and the Claims, which follow.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods set forth below provide high impedance discharge paths for the ESD protection elements for a die-to-die I/O (DTD_IO). By introducing additional impedance in ESD discharge path, ESD current is reduced proportionally to the impedance value. This reduction in current in turn improves ESD immunity approximately by 50 percent when compared to a conventional device, the circuits and methods rely on high impedance discharge paths through self-protecting drivers. The increase of ESD protection is accomplished by proportional lowering of ESD current due to the high impedance discharge path through the ESD protection elements. The lowering of ESD current reduces stress on the self-protecting ESD elements, which is better for ESD immunity. Several ways to achieve the high impedance path are described, including adding metal resistors, adding poly resisters, and incorporating substrate resistance in the discharge paths. The circuits and methods reduce the size of ESD protection elements.

It should be noted that while it is generally desirable to minimize the impedance within an integrated circuit to reduce power consumption for example, the circuits and methods set forth below selectively provide additional impedance elements to increase impedance in a circuit to improve performance, and particularly improve the performance of an electrostatic discharge path by improving ESD immunity. That is, the circuits and methods are contrary to conventional practices of minimizing resistance in circuits such as input/output circuits, but rather increase the resistance to improve the performance of the circuit.

Figure 1:
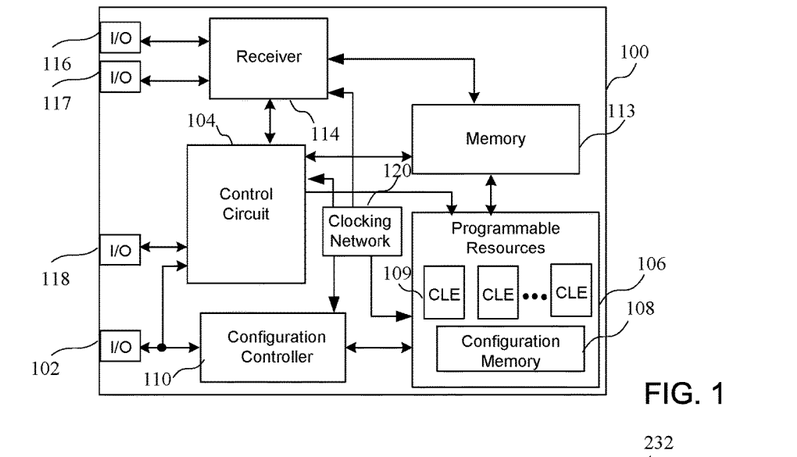
FIG. 1 is a block diagram of an integrated circuit having input/output pads.

Turning first to FIG. 1, a block diagram of an integrated circuit 100 comprising a circuit for having input/output pads is shown. In particular, an input/output port 102 is coupled to a control circuit 104 that controls programmable resources 106 having configurable logic elements 109. Configuration data may be provided to the configuration memory 108 by a configuration controller 110. The configuration data enables the operation of the programmable resources 106. A memory 113 may be coupled to the control circuit 104 and the programmable resources 106. A receiver circuit 114 may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1.

Figure 2:
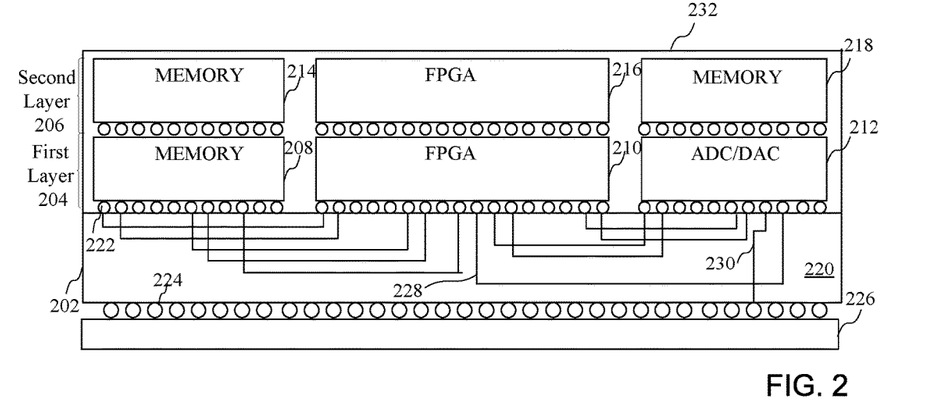
FIG. 2 is a cross-sectional view of a multi-die integrated circuit device.

Turning now to FIG. 2, a cross-sectional view of a multi-die integrated circuit device is shown. As shown in FIG. 2, a packaged integrated circuit 202 comprising a multi-die integrated circuit may include a plurality of layers of die. By way of example, the packaged integrated circuit 202 may include a first layer 204 having a first plurality of die and a second layer 206 having a second plurality of die. The first layer 204 may comprise a memory die 208, and FPGA die 210, and an analog-to-digital/digital-to-analog (ADC/DAC) die 212. Similarly, the second layer 206 may comprise a memory die 214, and FPGA die 216, and an ADC/DAC die 218. A substrate 220 configured to receive the first layer 204 of die comprise a plurality of interconnect elements that are coupled to contact elements 222, such as bond bumps, and enable a connection by way of contact elements 224, such as solder balls, to enable a connection to a circuit board 226. Alternatively, the die could be implemented on an interposer coupled to the substrate, where the interpose includes the interconnect elements. The interconnect elements may comprise metal traces 228 that enable the connection between two die or metal traces 230 that enable the connection between a contact element 222 and a contact element 224. The circuit of FIGS. 1 and 2 are shown by way of example, where the various elements of the circuit for implementing a discharge path in an input/output path could be implemented in the circuits of FIGS. 1 and 2 as described below.

Figure 3:
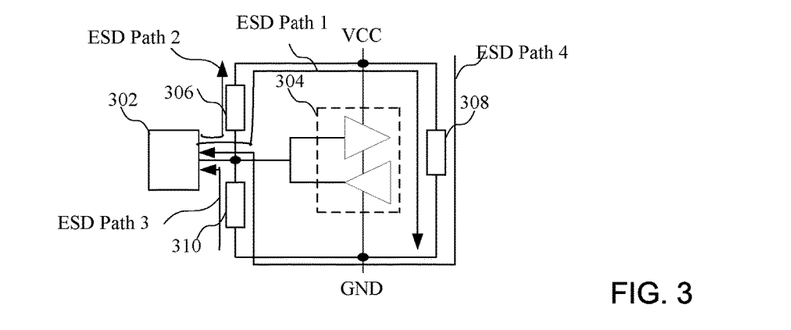
FIG. 3 is a block diagram of a contact pad showing the possible ESD paths.

Turning now to FIG. 3, a block diagram of a contact pad shows the possible ESD paths. More particularly, a contact pad 302 is coupled to an input/output circuit 304 coupled between a power reference voltage VCC and a ground voltage GND. Various electrostatic discharge paths exist in FIG. 3, where an ESD protection element can be in the various paths. More particularly, ESD protection element 306 can be implemented in ESD path 2, ESD protection element 308 can be implemented in ESD paths 1 and 4, and ESD protection element 310 can be implemented in ESD path 3. The electrostatic discharge element 308 coupled between VCC and GND can be achieved through supply clamps, such as RC clamps or ggNMOS clamps placed between VCC and GND rails, for example. The placement and location of ESD protection elements will be described in more detail below.

Figure 4:
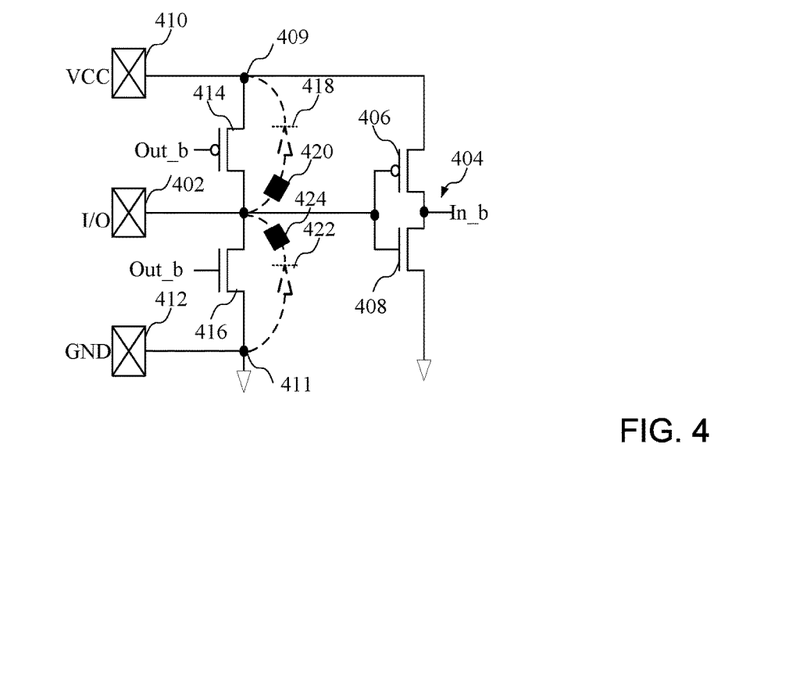
FIG. 4 is a block diagram showing an input/output pad and ESD paths associated with different nodes of an input/output circuit coupled to the input/output pad.

Turning now to FIG. 4, a block diagram shows an input/output pad and ESD paths associated with different nodes of an input/output circuit coupled to the input/output pad. As shown in FIG. 4, an input/output (I/O) pad 402 is coupled to an inverter circuit 404 having a P-channel transistor 406 coupled in series with an N-channel transistor 408. An input signal (In) coupled to the I/O pad 402 is coupled to the gates of the transistors 406 and 408, where an inverted input signal (In-b) based upon the input signal is generated at the drains of the transistors 406 and 408. The circuit further comprises an I/O pad 410 coupled to receive a power reference voltage, shown here as VCC, and an I/O pad 412 coupled to receive a ground (GND) potential. An output signal (Out) is generated at the I/O pad 402 based upon an inverted input signal (Out_b) coupled to the gates of a P-channel transistor 414 and an N-channel transistor 416 coupled in series between VCC and GND as shown.

Figure 5:
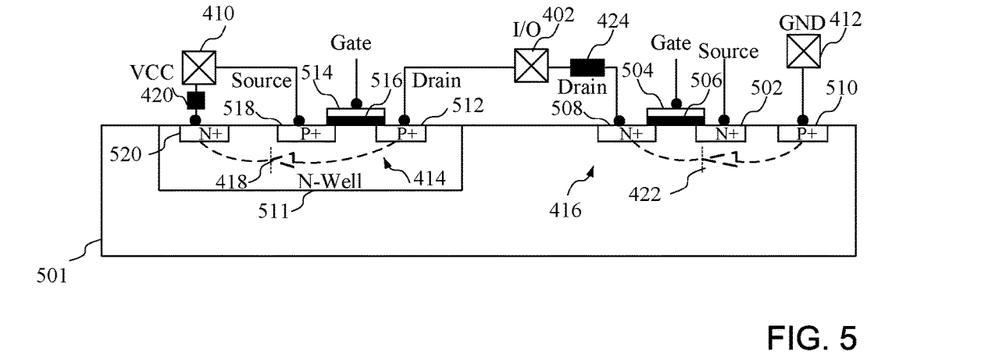
FIG. 5 is a cross-sectional view of the circuit of FIG. 4.

The circuit of FIG. 4 is susceptible to ESD events, and particularly at PN junctions of the device, such as a first discharge path 418 between a node 409 at the I/O pad 410 and the I/O pad 402 and a second discharge paths 422 between the I/O pad 402 and a node 411 at the I/O pad 412, as will be more apparent in the cross-sectional view of the circuit of FIG. 4 implemented in a substrate as shown in FIG. 5. An impedance element 420 associated with the transistor 414 is implemented between the source of transistor 414 and the I/O pad 402. Similarly, an impedance element 424 is implemented between the drain of the transistor 416 and the I/O contact pad 412. The impedance between the source of the transistor 414 and the I/O contact pad 402 and the impedance between the drain of the transistor 416 and the I/O contact pad 412 could be increased from approximately 50 Ohms to approximately 100 Ohms for example. The impedance elements 420 and 424 may be implemented as shown in FIG. 5.

Turning now to FIG. 5, a cross-sectional view of the circuit of FIG. 4 is shown. According to the implementation of FIG. 5, the impedance elements 420 and 424 are implemented above the substrate. The impedance elements 420 and 424 could be implemented as metal traces in the back-end-of-line (BEOL) layers formed on the substrate. Alternatively, the impedance elements 420 and 424 could be as a resistive element formed above substrate. By way of example, the resistive element could be a resistive polysilicon material deposited on the substrate and being connected between the I/O pad and the source or drain of the transistor. The impedance element 420 could be coupled to I/O contracts associated with the I/O pads external to the IC package incorporating the circuit. A substrate 501, which may be a P-type substrate for example, comprises elements for forming the transistors 414 and 416, for example. The transistor 416 comprises a source region 502, which may be an N-doped (N+) region, for example, a gate 504 formed over a gate insulator 506, and a drain region 508, which may also be an N-doped (N+) region. A diffusion tap, shown here as a P+ tap 510 in the substrate 501, is coupled to the ground I/O pad 412. As can be seen in FIG. 5, the ESD protection element 424 is implemented above the substrate and between the drain region 508 and the I/O pad 402.

The P-channel transistor 414 is formed in an N-well 511, and comprises a drain region 512, which may be a P+ diffusion region in the N-well 511, a gate 514 formed over a gate oxide region 516, and a source region 518. The ESD protection element 420 is coupled between a diffusion tap, shown here as an N+ tap, and the VCC I/O pad 410. As can be seen, the ESD protection element 420 is coupled between the VCC I/O pad 410 and the N+ tap 520 associated with the discharge path 418 between the P+ diffusion region 512 and the N+ diffusion region 520. Similarly, the ESD protection element 424 is coupled between the I/O pad 402 and the N+ diffusion region 508 associated with the discharge path 422.

Figure 6:
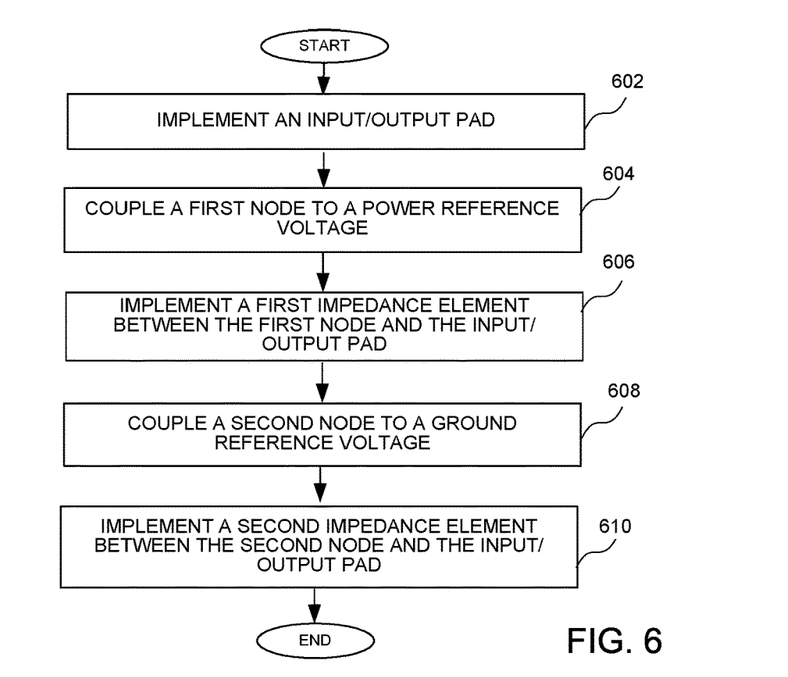
FIG. 6 is a flow chart showing a method of creating high impedance discharge paths in an integrated circuit.

Turning now to FIG. 6, a flow chart shows a method of creating high impedance discharge paths in an integrated circuit. An input/output pad is implemented at a block 602, and a first node is coupled to a power reference voltage at a block 604. The first node could be node 409 coupled to the I/O pad 410 that receives the VCC voltage. A first impedance element is implemented between the first node and the input/output pad at a block 606. As described above in reference to FIG. 5, the first impedance element could be impedance element 420 coupled to the VCC I/O pad 410. A second node is coupled to a ground reference voltage at a block 608. A second impedance element is implemented between the second node, such as node 411, and the input/output pad, such as I/O pad 402, at a block 610. The second impedance element could be impedance element 424.

Figure 7:
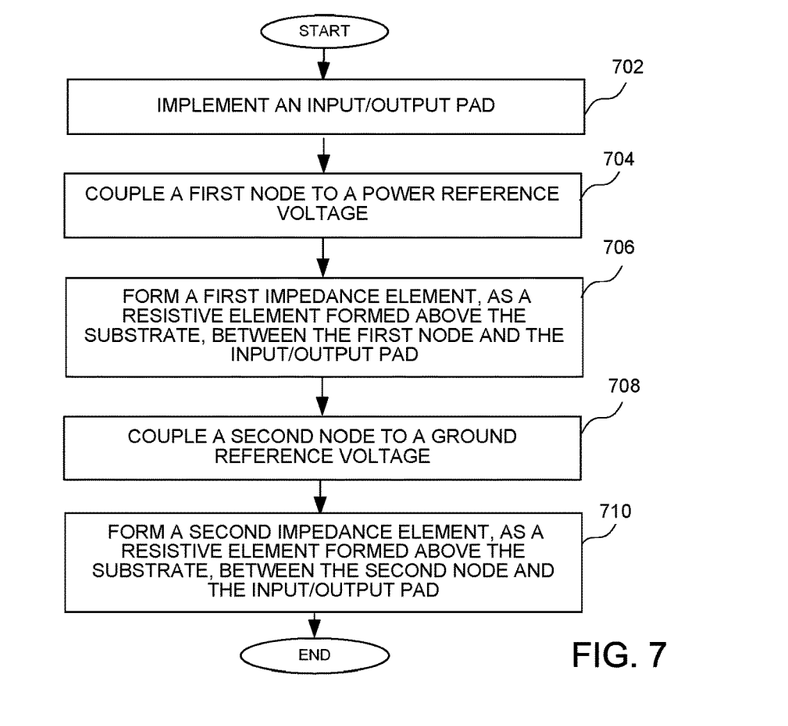
FIG. 7 is a flow chart showing another method of creating high impedance discharge paths in an integrated circuit.

Turning now to FIG. 7, a method of creating high impedance discharge paths in an integrated circuit is shown. An input/output pad is implemented at a block 702. A first node is coupled to a power reference voltage at a block 704. A first impedance element is formed, as a resistive element, above the substrate between the first node and the input/output pad at a block 706. By way of example, the first impedance element could be formed between the drain region 512 and the I/O pad 420, as shown in FIG. 5. A second node is coupled to a ground reference voltage at a block 708. A second impedance element is formed, as a resistive element, above the substrate, between the second node and the input/output pad at a block 710. By way of example, the second impedance element could be formed on the substrate between the drain region 508 and the I/O pad 402. As described above, the first and second resistive elements could be metal traces or a polysilicon resistor, for example.

Figure 8:
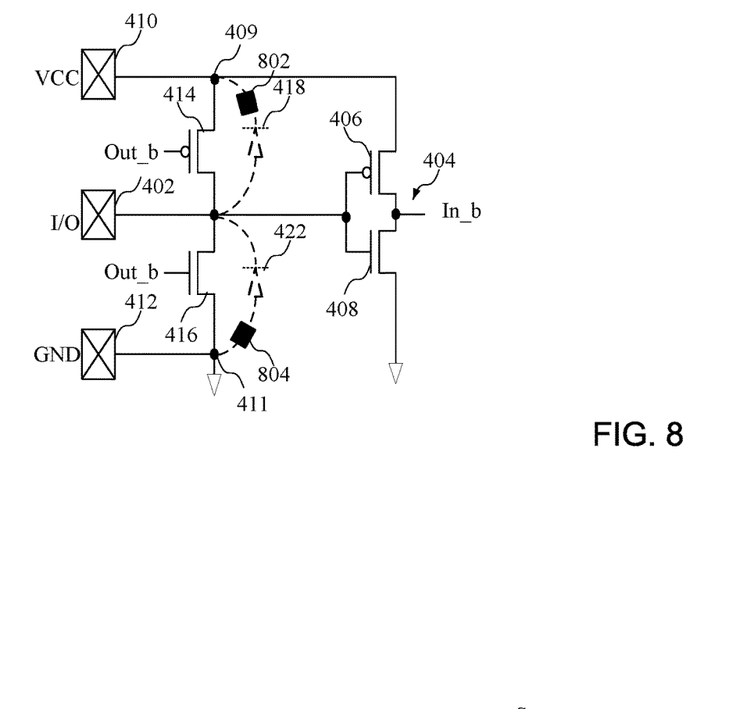
FIG. 8 is another block diagram showing an input/output pad and ESD paths associated with nodes of an input/output circuit coupled to the input/output pad.
Figure 9:
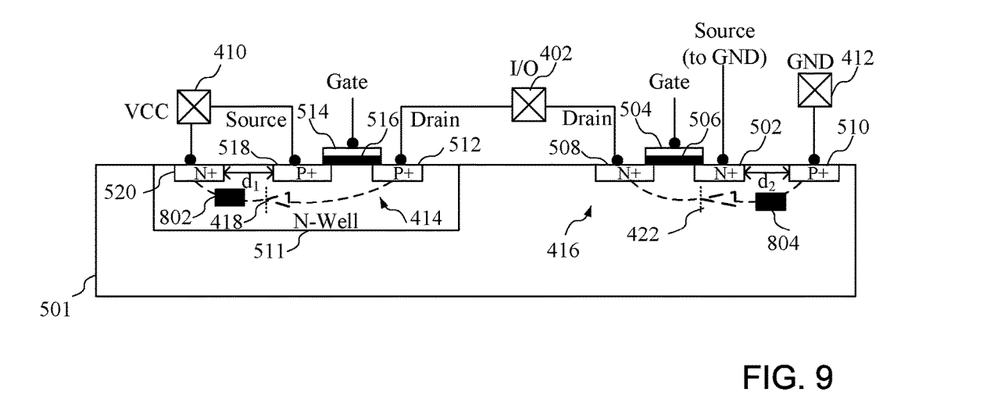
FIG. 9 is a cross-sectional view of the circuit of FIG. 8.

Turning now to FIG. 8, another block diagram shows an input/output pad and ESD paths associated with nodes of an input/output circuit coupled to the input/output pad. As shown in FIGS. 8 and 9, the impedance elements are formed in the substrate. More particularly, impedance element 802 coupled between the P+ diffusion region 512 and the N+ diffusion region 520. Similarly, the impedance element 804 is coupled between the P+ diffusion region 510 and the N+ diffusion region 508. The impedance elements 802 and 804 may be doping regions or implant regions, such as deep well regions formed in the substrate. For example, the impedance element 802 may be a P-type implant formed between the P+ diffusion region 512 and the N+ tap 520 in the N-well 511, while the impedance element 804 may be P-type implant formed in the P-type substrate between the P+ tap 510 and the N+ diffusion region 508. The dopant could either be localized to an area that would affect the resistance between the input/output pad and the reference or ground pad, or the dopant could be provided in the entire area (i.e. the entire substrate 501 or the entire n-well 511). However, the impedance elements 802 and 804 could be an N-type implant, or any other type of implant. Examples of p-type implant materials include Boron, Aluminium, Nitrogen, Gallium, and Indium, while examples of n-type implant materials include Phosphorus, Arsenic, Antimony, Bismuth, and Lithium, for example. However, it should be understood that other n-type or p-type implant materials could be used.

Additional impedance could be created in the discharge paths by increasing the distance of the discharge path. For example, the diffusion region 512 and the diffusion region 520 could be separated by a greater distance by setting a distance $d_1$ between the diffusion region 520, also known as an N-tap, and the diffusion region 518 at a maximum distance, and the diffusion region 510 and the diffusion region 508 could be separated by a greater distance by setting a distance $d_2$ between the diffusion region 510, also known as a P-tap, and the diffusion region 508 at a maximum distance. By way of example, while d1 and d2 may be approximately 1-2 microns without increasing the resistance, these distances may be extended to a maximum distance of approximately 30 microns according to the circuits and methods set forth below. This maximum distance may be determined by process requirements for manufacturing the integrated circuit device. For example, a process requirement for a certain device may indicate that a P-tap be placed within a predetermined distance of another P-tap or some other element of the substrate such as another diffusion region, or an N-tap within the predetermined distance of another N-tap or some other element of the substrate such as another diffusion region. For example, it may be a requirement that a P-tap or N-tap be placed within 32 microns of another P-tap or N-tap or some other diffusion region. Therefore, the distances $d_1$ and $d_2$ would be approximately 32 microns. By selecting the location of a P-tap to be extended to the maximum allowable distance from another element, for example making distances $d_1$ and $d_2$ as large as possible within design rules, it is possible to maximize the resistance associated with the I/O pad and therefore improve the ESD properties of the I/O pad. However, it should be understood that other process requirements may affect the placement of the P-tap or N-tap, and that the distance between the P-tap and a well of a transistor or an N-tap and a well of a transistor would be maximized without violating a process requirement.

Figure 10:
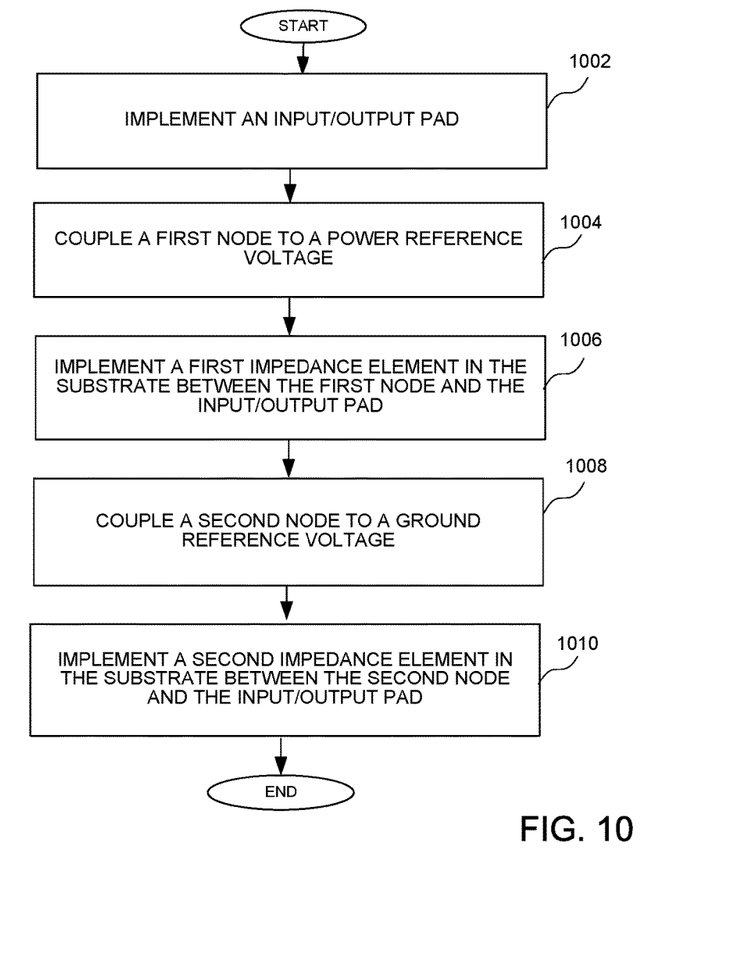
FIG. 10 is another method of creating high impedance discharge paths in an integrated circuit.

Turning now to FIG. 10, another method of creating high impedance discharge paths in an integrated circuit is shown. An input/output pad is implemented at a block 1002. A first node is coupled to a power reference voltage at a block 1004. A first impedance element is implemented in the substrate between the first node and the input/output pad at a block 1006. The first impedance element could be impedance element 802 of FIG. 9, for example. A second node is coupled to a ground reference voltage at a block 1008. A second impedance element is implemented in the substrate between the second node and the input/output pad at a block 1010. The second impedance element could be impedance element 804 of FIG. 9, for example.

Figure 11:
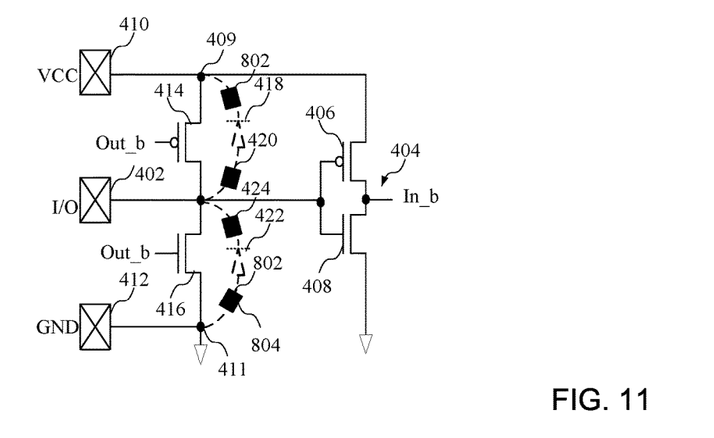
FIG. 11 is a block diagram showing an input/output pad and ESD paths associated with different nodes of an input/output circuit coupled to the input/output pad and having the elements to create a high impedance discharge path of both FIGS. 4 and 8.
Figure 12:
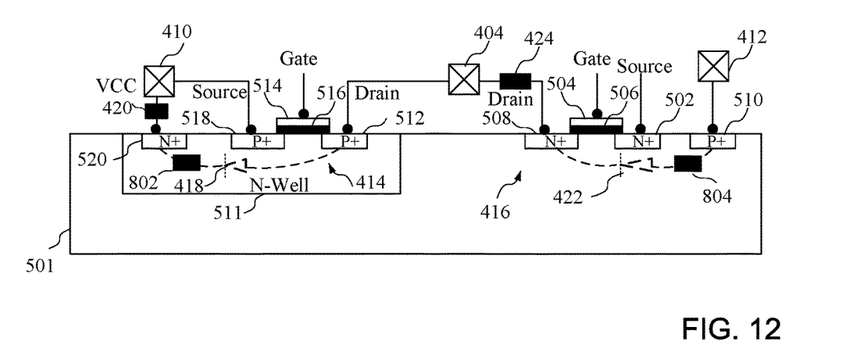
FIG. 12 is a cross-sectional view of the circuit of FIG. 11.

Turning now to FIG. 11, a block diagram shows an input/output pad and ESD paths associated with different nodes of an input/output circuit coupled to the input/output pad and having the elements to create high impedance discharge paths of both FIGS. 4 and 8. The cross-sectional view of the circuit of FIG. 11 is shown in FIG. 12. As can be seen, impedance elements are provided both within and above the substrate, as described above in reference to FIGS. 4-5 and 8-9. However, it should be noted that other combinations of impedance elements could be implemented. For example, one impedance element could be associated with one of the nodes 409 and 411, and two impedance elements could be associated with the other of nodes 409 and 411. Further, one of the nodes may have an impedance element above the substrate, and the other of the nodes 409 and 411 may have an impedance element below the substrate.

Figure 13:
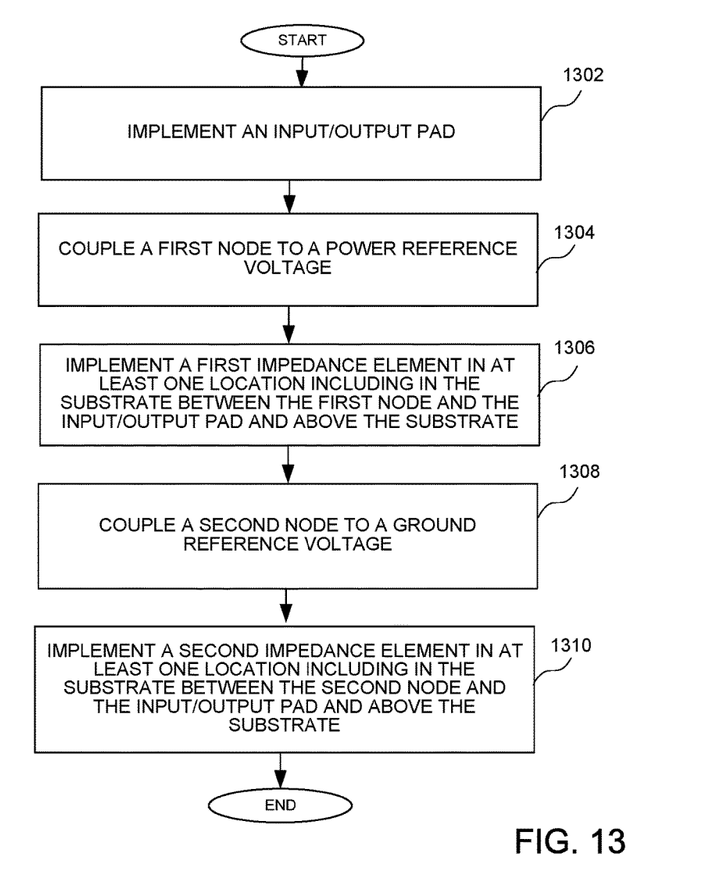
FIG. 13 is another method of creating high impedance discharge paths in an integrated circuit.

Turning now to FIG. 13, another method of creating high impedance discharge paths in an integrated circuit is shown. An input/output pad is implemented at a block 1302. A first node is coupled to a power reference voltage at a block 1304. A first impedance element is implemented in at least one location including in the substrate between the first node and the input/output pad or above the substrate at a block 1306. A second node is coupled to a ground reference voltage at a block 1308. A second impedance element is implemented in at least one location including in the substrate between the second node and the input/output pad or above the substrate at a block 1310. As described above, the impedance elements could be implemented as any combination or one or two impedance elements, and in the case of a single impedance element, either above or within the substrate.

While specific elements of the methods of FIGS. 6, 7, 10 and 13 are described, it should be understood that additional elements of the method, or additional details related to the elements, could be implemented according to the disclosure of FIGS. 1, 5, 8, 9, 11 and 12. It can therefore be appreciated that new circuits for and methods of implementing a discharge path in an input/output circuit has been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A circuit for implementing a discharge path in an input/output circuit of an integrated circuit, the circuit comprising:
   an input/output pad;
   a first node coupled to a power reference voltage;
   a first impedance element implemented in a substrate between the first node and the input/output pad;
   a second node coupled to a ground reference voltage; and
   a second impedance element implemented in the substrate between the second node and the input/output pad;
   wherein a first distance between the first node and the input/output pad is selected to increase an impedance of the first impedance element of a first electrostatic discharge path between the input/output pad and the first node;
   wherein a second distance between the second node and the input/output pad is selected to increase an impedance of the second impedance element of a second electrostatic discharge path between the input/output pad and the second node; and
   wherein the impedance of the first impedance element is selected based upon a first location of the first node comprising a first tap in the substrate and the impedance of the second impedance element is selected based upon a second location of the second node comprising a second tap in the substrate.

2. The circuit of claim 1 wherein the first location is selected based upon a process requirement to maximize the first impedance and the second location is selected based upon the process requirement to maximize the second impedance.

3. The circuit of claim 1 wherein the first location is selected based upon a maximum distance from the first tap to another element of the integrated circuit and the second location is selected based upon a maximum distance from the second tap to another element of the integrated circuit.

4. The circuit of claim 1 wherein the first impedance element and the second impedance element comprise one of a doping material or an implant.

5. The circuit of claim 1 wherein the integrated circuit comprises a first die implemented on an interposer, wherein the circuit is implemented in the first die.

6. The circuit of claim 1 wherein the integrated circuit comprises a first die stacked on a second die, wherein the circuit is implemented in the first die.

7. The circuit of claim 1 wherein the first distance comprises a distance between the first node and a first transistor coupled to the input/output pad that is approximately 30 microns, and the second distance comprises a distance between the second node and a second transistor coupled to the input/output pad that is approximately 30 microns.

8. The circuit of claim 1 wherein the first distance comprises a distance between the first node and a first transistor coupled to the input/output pad that is within a range of approximately 2 microns to approximately 30 microns, and the second distance comprises a distance between the second node and a second transistor coupled to the input/output pad that is within a range of approximately 2 microns to approximately 30 microns.

9. The circuit of claim 1 wherein the first distance comprises a distance between the first node and a first transistor coupled to the input/output pad that is within a range of approximately 2 microns to a largest possible distance within a design rule, and the second distance comprises a distance between the second node and a second transistor coupled to the input/output pad that is within a range of approximately 2 microns to the largest possible distance within the design rule.

10. The circuit of claim 1 wherein the first distance comprises a distance between the first node and a first transistor coupled to the input/output pad that is as large as possible within a design rule, and the second distance comprises a distance between the second node and a second transistor coupled to the input/output pad that is as large as possible within the design rule.

11. A method of implementing a circuit having a discharge path in an input/output circuit of an integrated circuit, the method comprising:
    implementing an input/output pad;
    selecting a first location of a first node comprising a first tap in a substrate;
    coupling the first node to a power reference voltage;
    implementing a first impedance element in the substrate between the first node and the input/output pad;
    selecting a second location of a second node comprising a second tap in the substrate;
    coupling the second node to a ground reference voltage;
    implementing a second impedance element in the substrate between the second node and the input/output pad;
    selecting a first distance between the first node and the input/output pad to increase an impedance of the first impedance element of a first electrostatic discharge path between the input/output pad and the first node; and
    selecting a second distance between the second node and the input/output pad to increase an impedance of the second impedance element of a second electrostatic discharge path between the input/output pad and the second node.

12. The method of claim 11 wherein selecting the first location of the first node comprises selecting the first location based upon a process requirement to maximize the impedance of the first impedance element and selecting the second location of the second node comprises selecting the second location based upon the process requirement to maximize the impedance of the second impedance element.

13. The method of claim 11 wherein implementing the first impedance element and the second impedance element comprises implementing the first impedance element and the second impedance element using one of a doping material or an implant.

14. The method of claim 11 further comprising implementing the integrated circuit as a multi-chip module, wherein the integrated circuit comprises a first die implemented on an interposer, wherein the circuit is implemented in the first die.

15. The method of claim 11 further comprising implementing the integrated circuit as a multi-chip module, wherein the integrated circuit comprises a first die stacked on a second die, wherein the circuit is implemented in the first die.

16. The method of claim 11 wherein the first distance comprises a distance between the first node and a first transistor coupled to the input/output pad that is approximately 30 microns, and the second distance comprises a distance between the second node and a second transistor coupled to the input/output pad that is approximately 30 microns.

17. The method of claim 11 wherein the first distance comprises a distance between the first node and a first transistor coupled to the input/output pad that is within a range of approximately 2 microns to approximately 30 microns, and the second distance comprises a distance between the second node and a second transistor coupled to the input/output pad that is within a range of approximately 2 microns to approximately 30 microns.

18. The method of claim 11 wherein the first distance comprises a distance between the first node and a first transistor coupled to the input/output pad that is within a range of approximately 2 microns to a largest possible distance within a design rule, and the second distance comprises a distance between the second node and a second transistor coupled to the input/output pad that is within a range of approximately 2 microns to the largest possible distance within the design rule.

19. The circuit of claim 11 wherein the first distance comprises a distance between the first node and a first transistor coupled to the input/output pad that is as large as possible within a design rule, and the second distance comprises a distance between the second node and a second transistor coupled to the input/output pad that is as large as possible within the design rule.

* * * * *